(12) United States Patent
Myers et al.

(10) Patent No.: US 11,239,127 B2
(45) Date of Patent: Feb. 1, 2022

(54) TOPSIDE-COOLED SEMICONDUCTOR PACKAGE WITH MOLDED STANDOFF

(71) Applicant: Infineon Technologies AG, Neubiberg (DE)

(72) Inventors: Edward Myers, Unterhaching (DE); Liu Chen, Oberhaching (DE); Chee Chiew Chong, Batu Caves (MY); Wee Aun Jason Lim, Melaka (MY); Wee Boon Tay, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 41 days.

(21) Appl. No.: 16/906,617

(22) Filed: Jun. 19, 2020

(65) Prior Publication Data

US 2021/0398867 A1 Dec. 23, 2021

(51) Int. Cl.
| | |
|---|---|
| *H01L 23/48* | (2006.01) |
| *H01L 23/31* | (2006.01) |
| *H01L 23/36* | (2006.01) |
| *H01L 23/00* | (2006.01) |
| *H01L 21/56* | (2006.01) |
| *H01L 23/498* | (2006.01) |

(52) U.S. Cl.
CPC ........ *H01L 23/3121* (2013.01); *H01L 21/565* (2013.01); *H01L 23/36* (2013.01); *H01L 23/49861* (2013.01); *H01L 24/05* (2013.01)

(58) Field of Classification Search
CPC ... H01L 23/3121; H01L 23/36; H01L 23/495; H01L 23/49575; H01L 21/565
USPC .................. 257/787, 666, 676, 706, 713
See application file for complete search history.

(56) References Cited

U.S. PATENT DOCUMENTS

| | | | |
|---|---|---|---|
| 4,924,351 A * | 5/1990 | Kato | H01L 23/24 174/548 |
| 6,897,567 B2 * | 5/2005 | Horie | H01L 23/3107 257/779 |
| 7,768,105 B2 * | 8/2010 | Cruz | H01L 24/39 257/676 |
| 7,989,933 B1 * | 8/2011 | Kim | H01L 23/49503 257/676 |
| 9,812,373 B2 | 11/2017 | Fachmann et al. | |
| 2003/0075786 A1 * | 4/2003 | Joshi | H01L 23/49562 257/676 |
| 2009/0057855 A1 * | 3/2009 | Quinones | H01L 23/49575 257/676 |
| 2012/0108013 A1 * | 5/2012 | Fujisawa | H01L 21/52 438/123 |
| 2012/0181676 A1 * | 7/2012 | Tsui | H01L 24/49 257/675 |

(Continued)

*Primary Examiner* — Nitin Parekh
(74) *Attorney, Agent, or Firm* — Harrity & Harrity, LLP

(57) ABSTRACT

A molded semiconductor package arrangement may comprise a die pad configured to support a semiconductor; a set of leads; and a mold structure that is formed to enclose the semiconductor and the die pad within the mold structure. The set of leads and the die pad may be formed from a same piece of conductive material. An electrical contact plane of the set of leads may be offset from a bottom surface of the die pad. The mold structure may include a molded standoff that is beneath the die pad. A bottom surface of the molded standoff may extend below the electrical contact plane of the set of leads by a threshold distance that corresponds to a thickness of the molded standoff.

20 Claims, 12 Drawing Sheets

(56) References Cited

U.S. PATENT DOCUMENTS

| | | |
|---|---|---|
| 2014/0217620 A1 | 8/2014 | Yamagishi et al. |
| 2015/0162260 A1 | 6/2015 | Liao |
| 2015/0221582 A1* | 8/2015 | Miyakawa .............. H01L 24/35 257/676 |
| 2017/0229368 A1 | 8/2017 | Chiu et al. |
| 2021/0202357 A1* | 7/2021 | Poddar ................ H01L 23/3121 |

\* cited by examiner

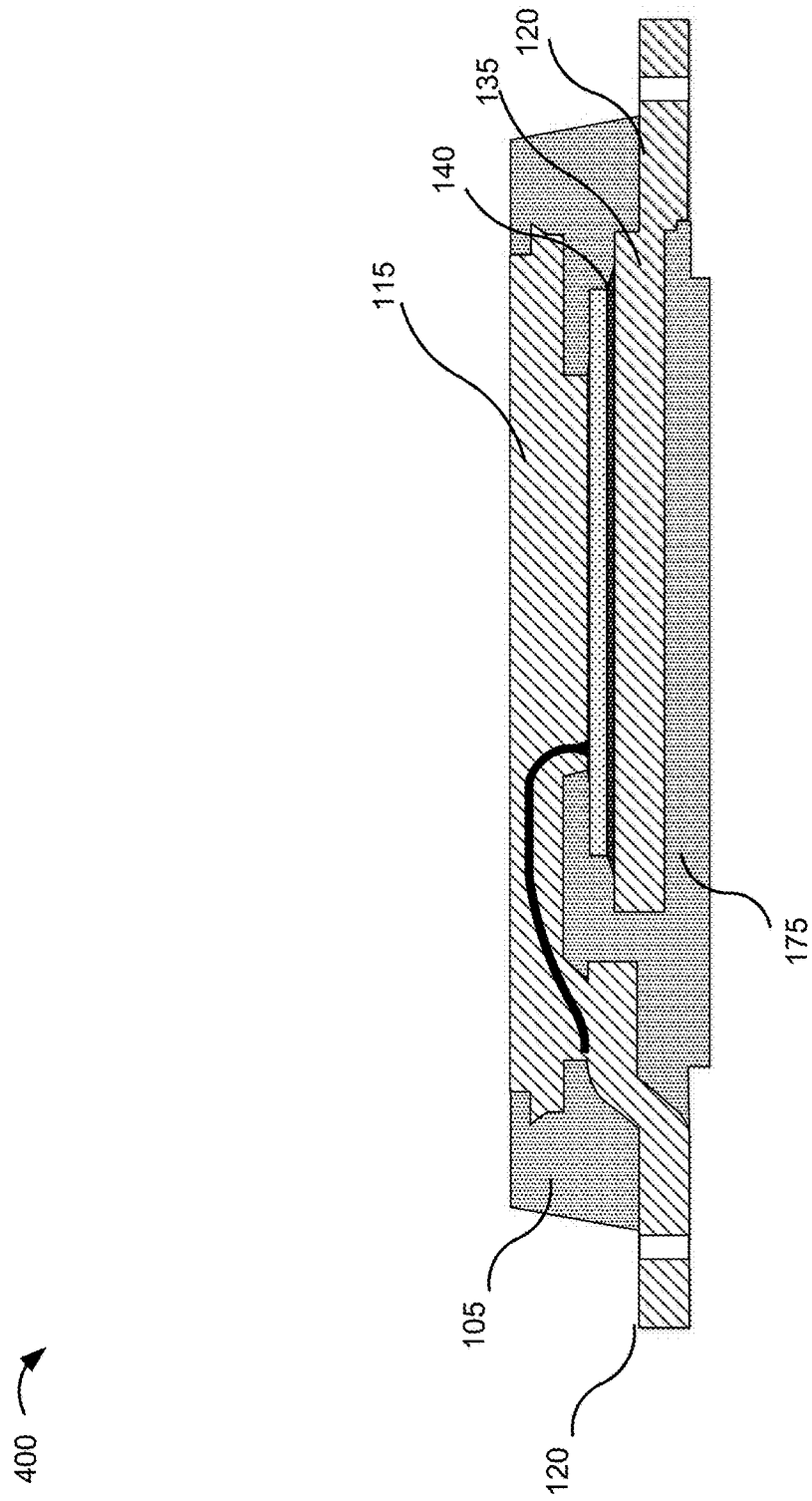

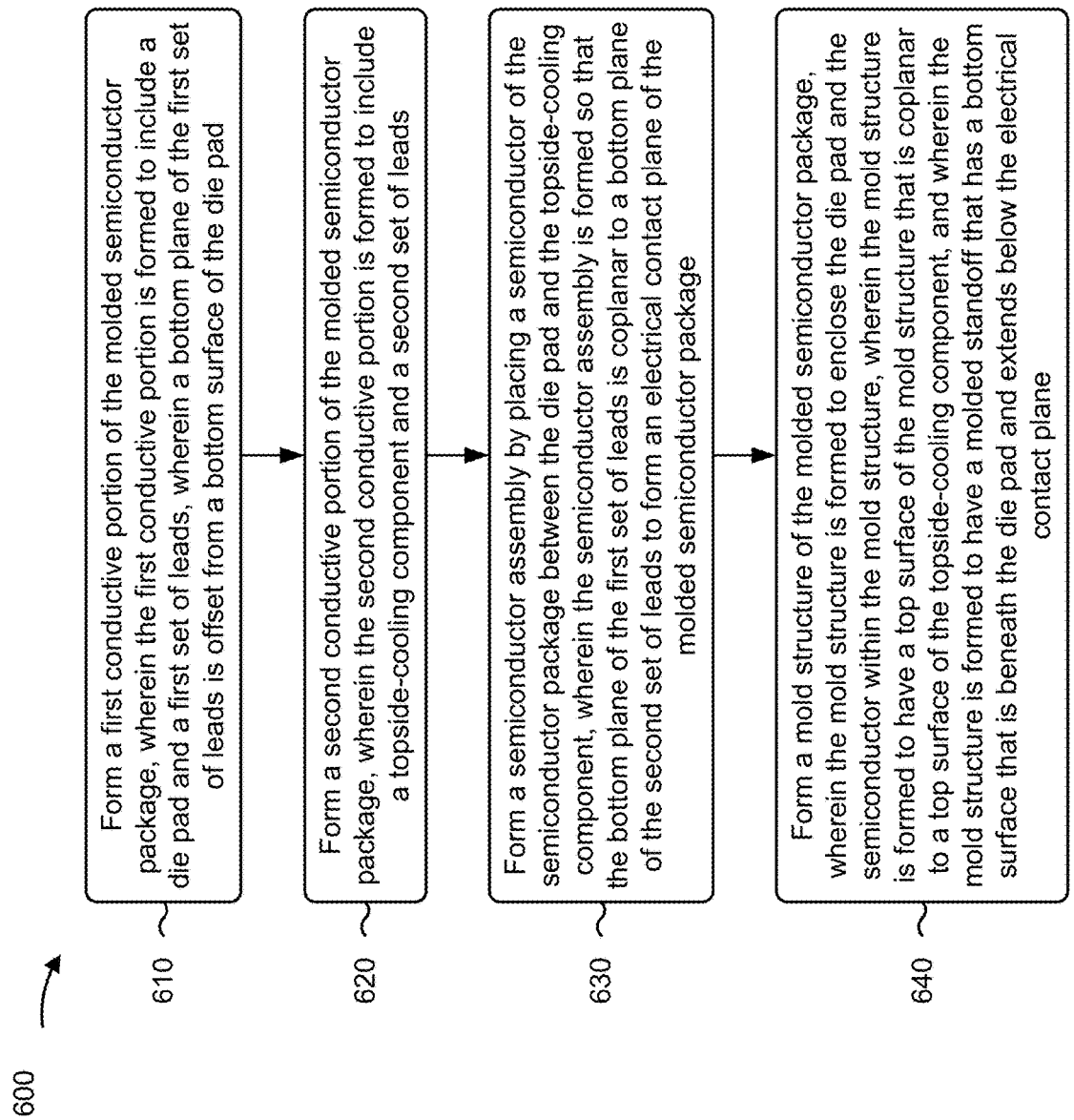

TOPSIDE-COOLED SEMICONDUCTOR PACKAGE WITH MOLDED STANDOFF

BACKGROUND

A semiconductor package may comprise a semiconductor (e.g., semiconductor chip) and material that encapsulates the semiconductor chip. The semiconductor package may be connected to a heatsink. In this regard, heat generated by the semiconductor may be dissipated toward the heatsink.

SUMMARY

According to some implementations, a topside-cooled semiconductor package may include a topside-cooling component; a die pad; a semiconductor situated between the die pad and the topside-cooling component; a plurality of leads, wherein a first set of leads, of the plurality of leads, and the die pad are formed from a same piece of conductive material, wherein a bottom plane of the first set of leads is offset from a bottom surface of the die pad, and wherein a second set of leads, of the plurality of leads, are connected to the topside-cooling component, wherein a bottom plane of the second set of leads is coplanar to the bottom plane of the first set of leads within an electrical contact plane of the plurality of leads; and a mold structure that is formed to enclose the semiconductor, the die pad, and a portion of the topside-cooling component within the mold structure, wherein the mold structure includes a molded standoff that is beneath the die pad and extends downward from the electrical contact plane.

According to some implementations, a molded semiconductor package arrangement may include a die pad configured to support a semiconductor; a set of leads, wherein the set of leads and the die pad are formed from a same piece of conductive material, wherein an electrical contact plane of the set of leads is offset from a bottom surface of the die pad; and a mold structure that is formed to enclose the semiconductor and the die pad within the mold structure, wherein the mold structure includes a molded standoff that is beneath the die pad, and wherein a bottom surface of the molded standoff extends below the electrical contact plane of the set of leads by a threshold distance that corresponds to a thickness of the molded standoff.

According to some implementations, a method may include forming a first conductive portion of the molded semiconductor package, wherein the first conductive portion is formed to include a die pad and a first set of leads, wherein a bottom plane of the first set of leads is offset from a bottom surface of the die pad; forming a second conductive portion of the molded semiconductor package, wherein the second conductive portion is formed to include a topside-cooling component and a second set of leads; forming a semiconductor assembly by placing a semiconductor of the semiconductor package between the die pad and the topside-cooling component, wherein the semiconductor assembly is formed so that the bottom plane of the first set of leads is coplanar to a bottom plane of the second set of leads to form an electrical contact plane of the molded semiconductor package; and forming a mold structure of the molded semiconductor package, wherein the mold structure is formed to enclose the die pad and the semiconductor within the mold structure, wherein the mold structure is formed to have a top surface of the mold structure that is coplanar to a top surface of the topside-cooling component, and wherein the mold structure is formed to have a molded standoff that has a bottom surface that is beneath the die pad and extends below the electrical contact plane.

BRIEF DESCRIPTION OF THE DRAWINGS

FIGS. 4A-4E are diagrams of an example process for manufacturing the topside-cooled semiconductor package of FIGS. 1A-1C.

FIG. 6 is a flow chart of an example process for manufacturing a molded semiconductor package.

DETAILED DESCRIPTION

Figure 1A:
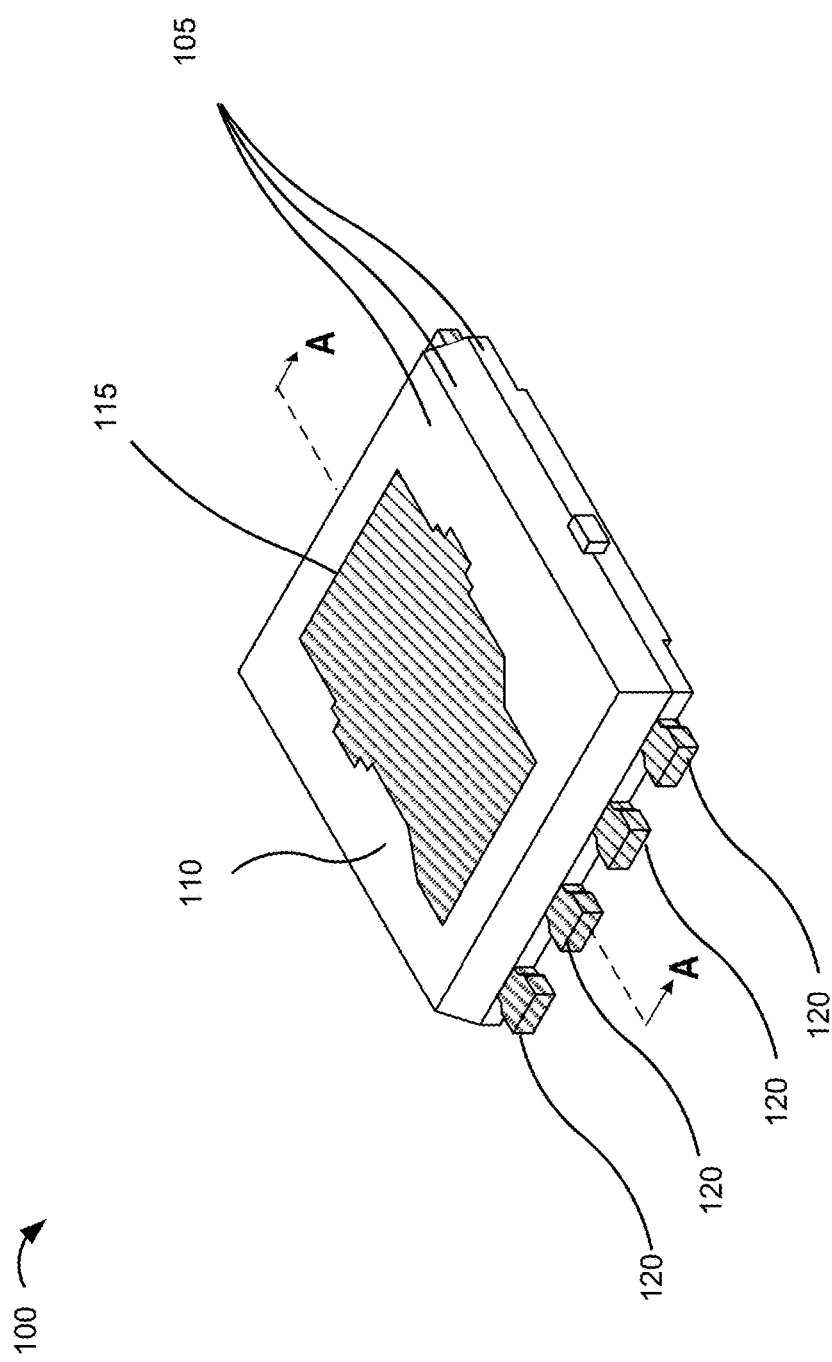
FIGS. 1A-1C are diagrams of an example topside-cooled semiconductor package described herein.

The following detailed description of example implementations refers to the accompanying drawings. The same reference numbers in different drawings may identify the same or similar elements.

A molded semiconductor package may include a mold structure that is formed to enclose a semiconductor, a die paddle (or die pad) that supports the semiconductor, and a portion of a plurality of leads. The molded semiconductor package may be installed on a printed circuit board (PCB). In some implementations, the molded semiconductor package may be configured to cause heat, generated by the semiconductor, to dissipate toward a top surface of the molded structure (as opposed to a bottom surface of the molded structure toward the PCB). In such instance, the molded semiconductor package may include a topside cooling component on the top surface of the molded structure. The topside cooling component may be connected to a heatsink.

Previous techniques of manufacturing such a molded semiconductor package do not account for sufficient clearance or space beneath (or below) the die paddle. Such insufficient clearance or space causes the mold compound (of the molded structure) to be incompletely filled underneath the die paddle. The incomplete filing of the mold compound creates holes and/or empty areas (e.g., pin holes and/or areas) in a bottom surface of the molded structure. In other words, portions of the bottom surface of the molded structure (e.g., a corner portion) may be missing (e.g., because of the incomplete filling of the mold compound). Because such portions are missing, internal structures within the molded semiconductor package may be exposed. Such exposure may cause humidity to be introduced in the molded semiconductor package. The humidity may result in the failure of the molded semiconductor package due to leakage of current and/or short circuit. The incomplete filling of the mold compound may have to be screened and may result in lower yield during a final optical inspection.

Some implementations described herein provide a topside-cooled molded semiconductor package. Some techniques described herein increase the clearance or space beneath the die pad based on an offset between the die pad and a set of leads connected to the die pad, thereby improving the flow of the mold compound under the die pad and more substantially filling the area beneath the die pad. The improved flow of the mold compound helps create a molded standoff that is beneath the die pad. The bottom surface of the molded standoff may be substantially parallel to the bottom surface of the die pad and/or the top surface of the topside cooling component (and/or the top surface of the molded structure), thereby reducing the likelihood of the molded semiconductor package tilting and/or rotating with respect to the PCB, when the molded semiconductor package is installed on the PCB. Additionally, the thickness of the molded standoff may increase thermal insulation at the bottom portion of the molded structure, thereby reducing or preventing possible damage to the PCB.

Figure 1B:
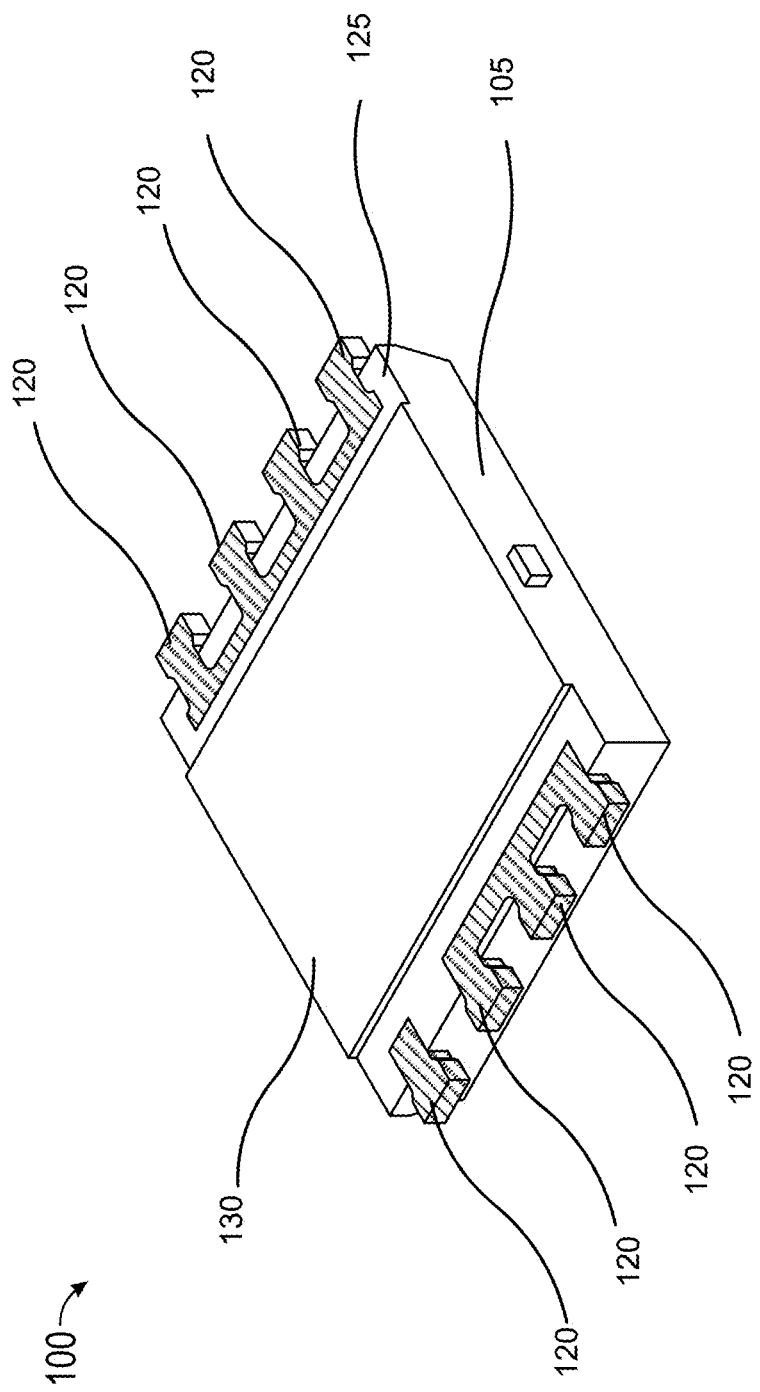
Figure 1C:
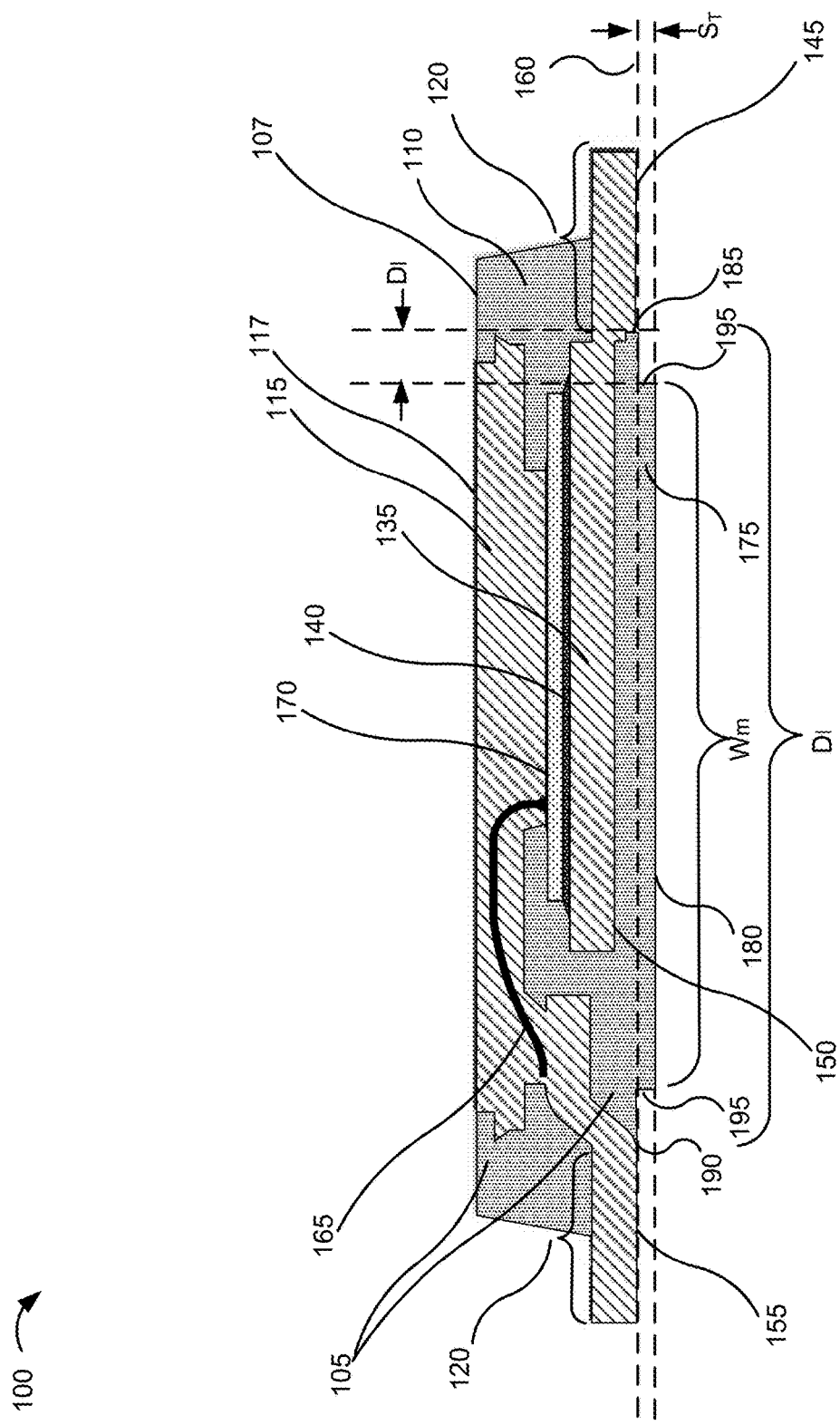

FIGS. 1A-1C are diagrams of an example topside-cooled semiconductor package 100 described herein. Topside-cooled semiconductor package 100 may comprise a topside-cooling component, a die pad, a semiconductor between the die pad and the topside-cooling component, a plurality of leads, and a mold structure that is formed to enclose the semiconductor, the die pad, a portion of the topside-cooling component, and a portion of the plurality of leads, as described in more detail below. In some implementations, topside-cooled semiconductor package 100 may installed on a printed circuit board (PCB).

FIG. 1A is a top view of topside-cooled semiconductor package 100. As shown in FIG. 1A, topside-cooled semiconductor package 100 may include a mold structure 105. A top surface 110 of mold structure 105 may include a topside-cooling component 115. Topside-cooling component 115 may include a component that enables heat, generated by topside-cooled semiconductor package 100, to be dissipated toward top surface 110 of mold structure 105. For example, topside-cooling component 115 may be connected to a heat dissipation device (e.g., a heatsink) to provide heat dissipation via top surface 110 of mold structure 105. As shown in FIG. 1A, a portion of topside-cooling component 115 may be enclosed by mold structure 105.

As shown in FIG. 1A, topside-cooled semiconductor package 100 may include leads 120 (referred to individually as "lead 120" and collectively as "leads 120"). Leads 120 may be adjacent to a side surface of mold structure 105. The number and arrangement of leads 120 shown in FIG. 1A are merely provided as an example. In practice, topside-cooled semiconductor package 100 may have a different (greater or lesser) number and/or a different arrangement of leads 120 than what is shown in FIG. 1A. Topside-cooling component 115 and leads 120 are discussed in more detail below with respect to FIG. 1C (which is a cross-section view of topside-cooled semiconductor package 100).

FIG. 1B is a bottom view of topside-cooled semiconductor package 100. As shown in FIG. 1B, a bottom surface 125 of mold structure 105 may include a molded standoff 130 that extends from bottom surface 125. Molded standoff 130 is discussed in more detail below. As shown in FIG. 1B, a first set of leads 120 may be adjacent to a first side surface of mold structure 105 and a second set of leads 120 may be adjacent to a second side surface of mold structure 105 that is opposite the first side surface. The number and arrangement of leads 120 shown in FIG. 1B are merely provided as an example. In practice, topside-cooled semiconductor package 100 may have a different (greater or lesser) number and/or a different arrangement of leads 120 than what is shown in FIG. 1B.

FIG. 1C is a cross-sectional view taken along line A-A of topside-cooled semiconductor package 100 illustrated in FIG. 1A. As shown in FIG. 1C, topside-cooled semiconductor package 100 may include topside-cooling component 115, a die pad (or die paddle) 135, a semiconductor 140 situated between topside-cooling component 115 and die pad 135, and leads 120. Topside-cooling component 115 may be configured to facilitate topside cooling associated with semiconductor 140 (e.g., by enabling heat dissipation of heat generated by semiconductor 140). For example, topside-cooling component 115 may be configured to cause heat, generated by semiconductor 140, to be dissipated toward top surface 110 of mold structure 105. As shown in FIG. 1C, topside-cooling component 115 may be connected to a set of leads 120. In some implementations, topside-cooling component 115 may connect a source terminal and/or a drain terminal of semiconductor 140 to the set of leads 120.

Die pad 135 may be configured to support semiconductor 140. As shown in FIG. 1C, die pad 135 and a set of leads 120 may be formed from a same piece of conductive material (e.g., a metal, such as copper and/or the like). The set of leads 120 connected to die pad 135 may correspond to a first set of leads 120. As shown in FIG. 1C, a bottom plane 145 of the first set of leads 120 may be offset from a bottom surface 150 of die pad 135. In some implementations, bottom plane 145 of the first set of leads 120 may be offset from bottom surface 150 of die pad 135 by at least half of a thickness of the piece of conductive material (prior to the first set of leads 120 and die pad 135 being formed, as described in more detail below in connection with FIG. 4A). The set of leads 120 connected to topside-cooling component 115 may correspond to a second set of leads 120.

As shown in FIG. 1C, a bottom plane 155 of the second set of leads 120 may be coplanar to bottom plane 145 of the first set of leads 120 within an electrical contact plane 160 of leads 120. Electrical contact plane 160 may correspond to bottom plane 145 and bottom plane 155. As shown in FIG. 1C, electrical contact plane 160 may be coplanar (or substantially coplanar) with respect to bottom surfaces of leads 120 that are to contact a PCB when topside-cooled semiconductor package 100 is installed on the PCB. In some implementations, the bottom surfaces may be substantially flat. As shown in FIG. 1C, electrical contact plane 160 may be offset from bottom surface 150 of die pad 135.

Semiconductor 140 may include a half bridge and/or a transistor such as, for example, a MOSFET (metal-oxide-semiconductor field effect transistor), an IGBT (insulated gate bipolar transistor), an HEMT (high-electron mobility transistor), and/or the like. As shown in FIG. 1C, topside-cooled semiconductor package 100 may include a trace 165 that connects an electrode 170 of semiconductor 140 to at least one of the second set of leads 120. For example, trace 165 may be a contact clip that is coupled to electrode 170 and coupled to one or more of the second set of leads 120. Additionally, or alternatively, trace 165 may be a wire. In some implementations, trace 165 may connect a gate terminal of semiconductor 140 to at least one of the second set of leads 120.

As shown in FIG. 1C, mold structure 105 may be formed to create an enclosure to enclose a portion of topside-cooling component 115, semiconductor 140, die pad 135, and a portion of leads 120. Mold structure 105 may be formed using a molding compound, as will be described in more detail below in connection with FIG. 4B. A top surface 107 of mold structure 105 may be coplanar with respect to a top surface 117 of topside-cooling component 115.

As shown in FIG. 1C, mold structure 105 includes a molded standoff 175 that is beneath die pad 135 and extends downward from electrical contact plane 160. As shown in FIG. 1C, a thickness (ST) of molded standoff 175 may be within a threshold range of half of a distance between bottom surface 150 of die pad 135 and a bottom surface 180 of molded standoff 175. In other words, bottom surface 180 of molded standoff 175 may extend below electrical contact plane 160 by a threshold distance that corresponds to thickness (ST) of molded standoff 175. In this regard, the thickness (ST) of molded standoff 175 may increase thermal insulation and, therefore, reduce heat dissipation toward bottom surface 180 of molded standoff 175 and a PCB.

A width ($W_m$) of molded standoff 175 may be less than a distance between inner edges 185 of the first set of leads 120 and inner edges 190 of the second set of leads 120. The width ($W_m$) of molded standoff 175 and the distance between inner edges 185 of the first set of leads 120 and inner edges 190 of the second set of leads 120 may allow solder material to settle and/or expand during the process of installing topside-cooling component 115 on the PCB, as described in more detail below in connection with FIG. 2. For example, as shown in FIG. 1C, lateral edge 195 of molded standoff 175 may be within a threshold distance D1 of inner edge 185 of the first set of leads 120 to allow solder material to settle and/or expand during the process of installing topside-cooling component 115 on a PCB, as described below. Similarly, lateral edge 195 of molded standoff 175 may be within the threshold distance D1 of inner edge 190 of the second set of leads 120.

As shown in FIG. 1C, bottom surface 180 of molded standoff 175 may be parallel (or substantially parallel) to bottom surface 150 of die pad 135 and/or top surface 117 of topside-cooling component 115. As shown in FIG. 1C, a vertical plane of lateral edge 195 may be perpendicular (or substantially perpendicular) with respect to electrical contact plane 160.

As indicated above, FIGS. 1A-1C are provided merely as examples. Other examples may differ from what is described with regard to FIGS. 1A-1C.

Figure 2:
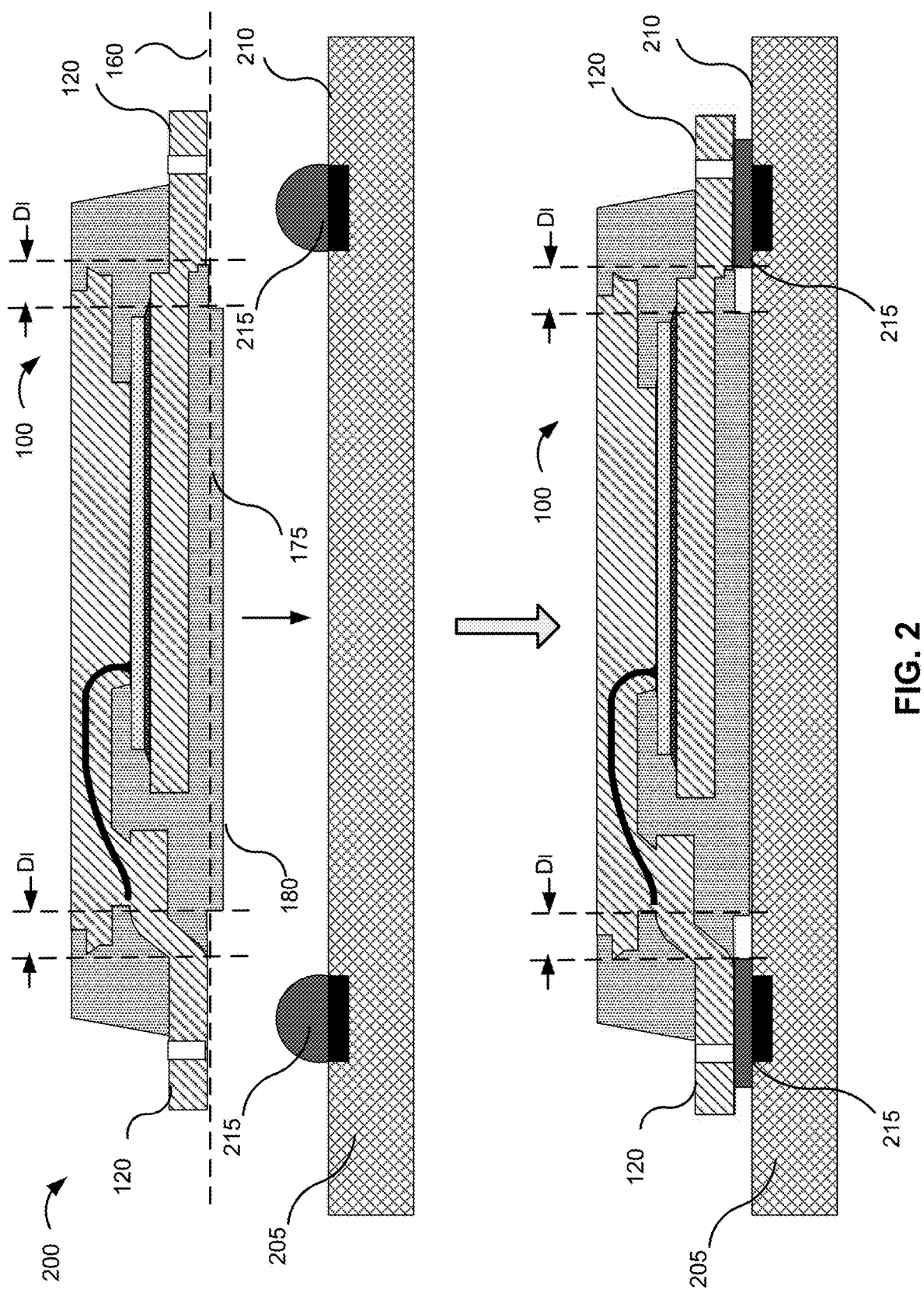
FIG. 2 is a diagram of an example implementation including the topside-cooled semiconductor package of FIGS. 1A-1C.

FIG. 2 is a diagram of an example implementation 200 including topside-cooled semiconductor package 100 of FIGS. 1A-1C. As shown in FIG. 2, topside-cooled semiconductor package 100 may be configured to be mounted to a substrate such as, for example, a PCB 205. PCB 205 may include a top surface 210. As shown in FIG. 2, top surface 210 of PCB 205 may be provided with solder balls 215 (referred to individually as "solder ball 215" and collectively as "solder balls 215"). Solder balls 215 may provide an electrical connection between PCB 205 and topside-cooled semiconductor package 100. For example, solder balls 215 may provide an electrical connection between PCB 205 and leads 120 along electrical contact plane 160. Additionally, or alternatively, top surface 210 of PCB 205 may be provided with a solder material (e.g., solder paste). The solder material may be deposited on the PCB via, for example, stencil printing. The number and arrangement of leads 120 and solder balls 215 are merely provided as an example. In practice, there may be a different (greater or lesser) number and/or a different arrangement of leads 120 and/or solder balls 215 than what is shown in FIG. 2.

As shown in FIG. 2, the threshold distance D1 between a lateral edge of molded standoff 175 and an inner edge of a lead 120 may allow a solder ball 215 to settle and/or expand laterally when topside-cooling component 115 is installed on a PCB. Additionally, by extending below electrical contact plane 160, molded standoff 175 may enable a lead 120 to be suspended above top surface 210 of PCB 205. In this regard, a solder ball 215 may expand vertically to contact a lead 120 along electrical contact plane 160. As shown in FIG. 2, bottom surface 180 of molded standoff 175 may be parallel (or substantially parallel) with and coplanar (or substantially coplanar) with top surface 210 of PCB 205, thereby providing a good mating between bottom surface 180 of molded standoff 175 may be parallel (or substantially parallel) with and coplanar (or substantially coplanar) with top surface 210 of PCB 205 (e.g., to prevent tilting and/or rotating of topside-cooled semiconductor package 100). Accordingly, topside-cooled semiconductor package 100 may be stabilized when installed on PCB 205, thereby reducing the likelihood of topside-cooled semiconductor package 100 tilting and/or rotating with respect to PCB 205.

As indicated above, FIG. 2 is provided merely as an example. Other examples may differ from what is described with regard to FIG. 2.

Figure 3:
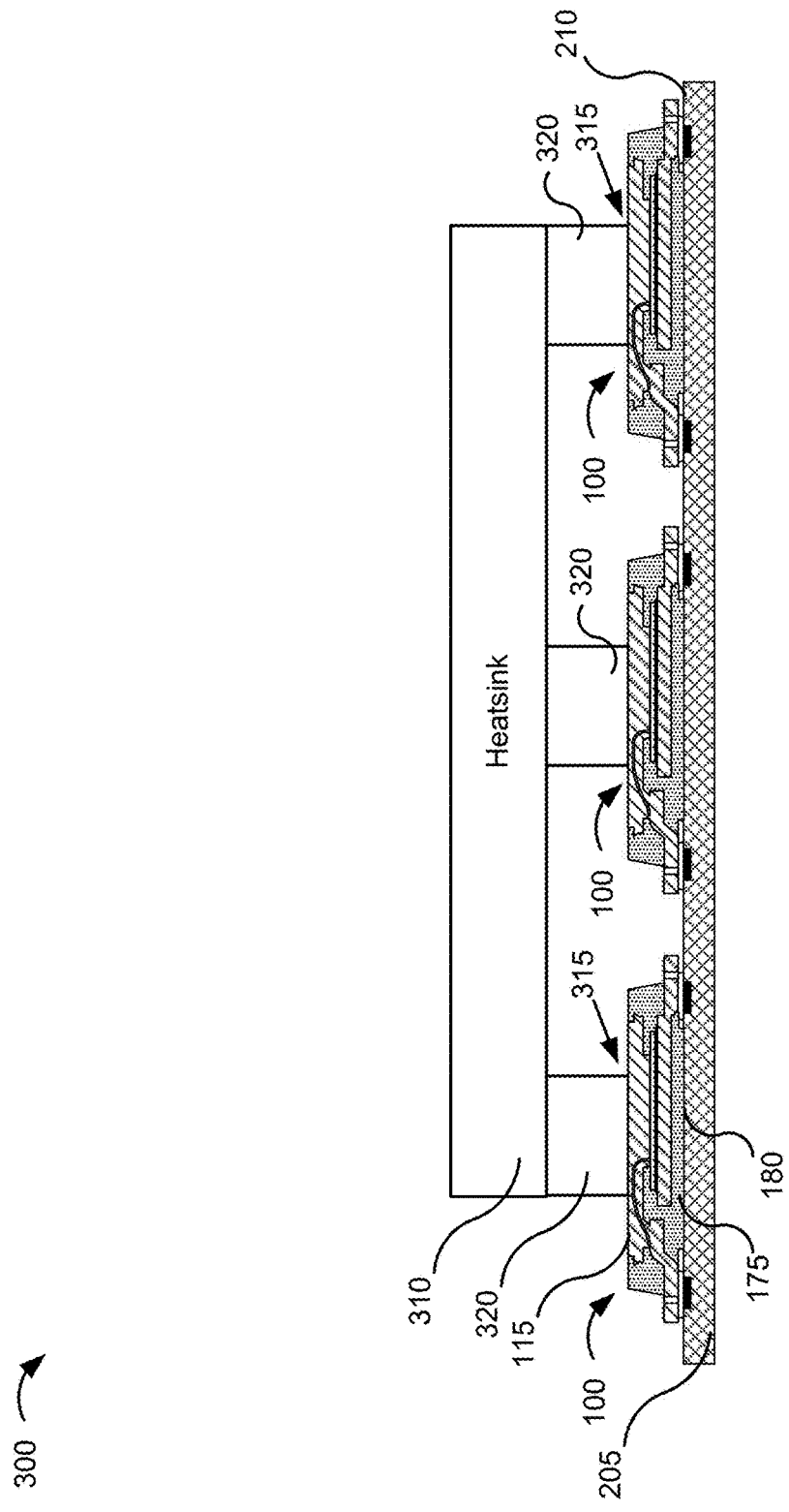
FIG. 3 is a diagram of an example implementation including the topside-cooled semiconductor package of FIGS. 1A-1C.

FIG. 3 is a diagram of an example implementation 300 including topside-cooled semiconductor package 100 of FIGS. 1A-1C. As shown in FIG. 3, multiple topside-cooled semiconductor packages 100 may be provided on top surface 210 of PCB 205. As shown in FIG. 3, a heatsink 310 may be provided thermally coupled to topside-cooled semiconductor packages 100. Heatsink 310 may be configured to provide heat dissipation to topside-cooled semiconductor packages 100. For example, heatsink 310 may direct heat, generated by topside-cooled semiconductor packages 100, away from a topside-cooling component 115 of a topside-cooled semiconductor package 100.

In some implementations, heatsink 310 may be flat. A thermal interfacial material (TIM) 315 may be provided between heatsink 310 and topside-cooled semiconductor packages 100. TIM 315 may form a good thermal coupling from topside-cooled semiconductor packages 100 to heat sink 310. TIM 315 may be thin, in order to provide as little thermal resistance as possible. In some implementations, molded standoff 175 being in direct contact with PCB 205 may result in a consistent height of topside-cooled semiconductor packages 100 and hence a consistent thickness of TIM 315.

In some embodiments, as shown in FIG. 3, heatsink 310 may have extending support structures 320 (referred to individually as "support structure 320" and collectively as "support structures 320") provided to be thermally coupled with topside-cooled semiconductor packages 100. In this regard, a support structure 320 may provide a thermal pathway that directs the heat away from topside-cooled semiconductor package 100 to heatsink 310.

As explained, bottom surface 180 of molded standoff 175 may be parallel (or substantially parallel) with and coplanar (or substantially coplanar) with top surface 210 of PCB 205. Accordingly, a topside-cooled semiconductor package 100 may be stabilized when installed on PCB 205, thereby reducing the likelihood of the topside-cooled semiconductor package 100 tilting and/or rotating with respect to PCB 205. Therefore, heatsink 310 may be stabilized when installed on the topside-cooled semiconductor package 100 using TIM 315 provided on a top surface of topside-cooling component 115 (e.g., between a support structure 320 and topside-cooling component 115). Using TIM 315 in this manner may provide a consistent placement of topside-cooled semiconductor packages 100 which in turn may allow only a thin TIM layer to be used as it may not be necessary for a variable thickness TIM layer to compensate for a variable thickness of solder material under topside-cooled semiconductor packages 100. Such a thin TIM layer may provide a low thermal resistance.

As indicated above, FIG. 3 is provided merely as an example. Other examples may differ from what is described with regard to FIG. 3.

Figure 4A:
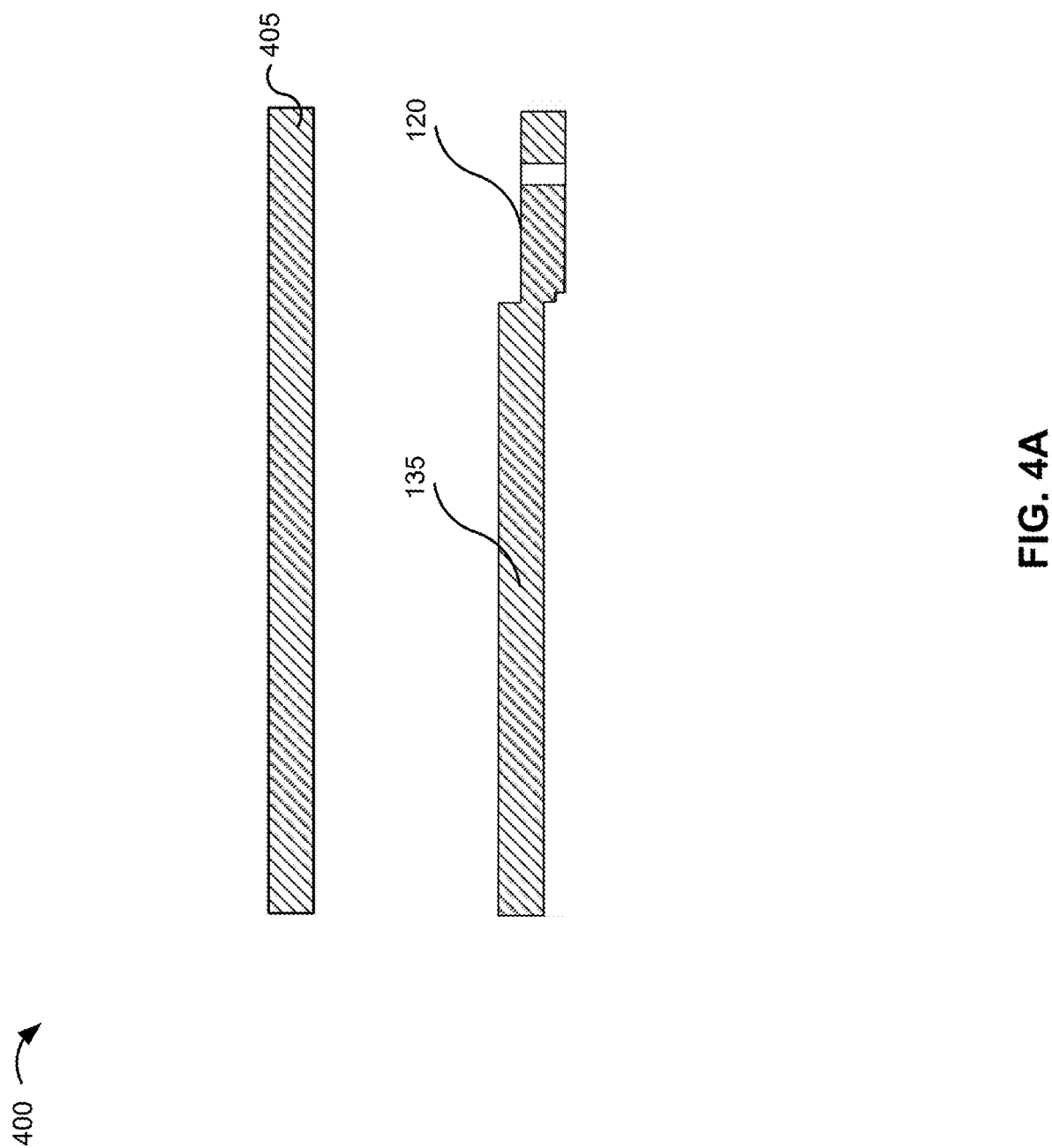
Figure 4B:
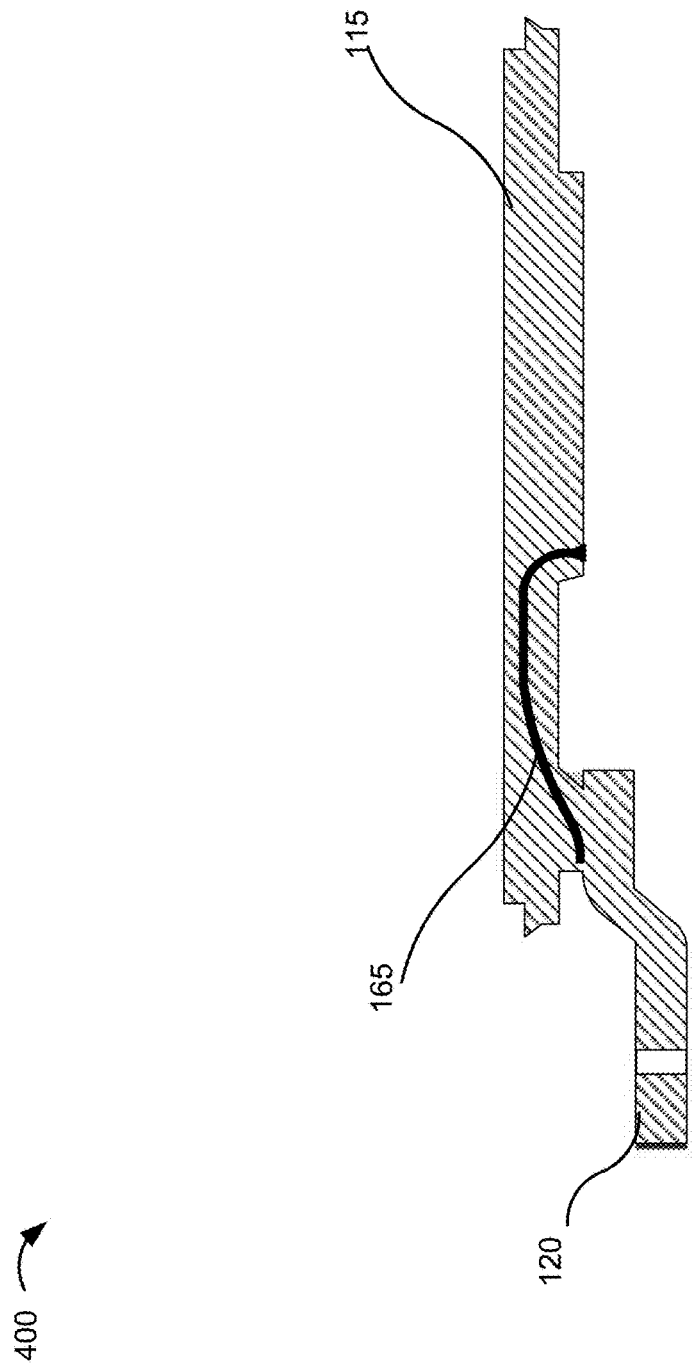

FIGS. 4A-4A are diagrams of an example process 400 for manufacturing the topside-cooled semiconductor package of FIGS. 1A-1C. As shown in FIG. 4A, a single piece of conductive material 405 (e.g., a metal, such as copper and/or the like) may be provided. As shown in FIG. 4, a first conductive portion of topside-cooled semiconductor package 100 may be formed, from conductive material 405, to include die pad 135 and the first set of leads 120. For example, the first conductive portion may be formed by punching a workpiece from a sheet of conductive material 405; and stamping die pad 135 or the first set of leads 120 to offset die pad 135 from the first set of leads 120. The offset may create sufficient clearance below die pad 135, thereby improving the flow of a mold compound to create molded standoff 175 beneath die pad 135. As shown in FIG. 4B, a second conductive portion of topside-cooled semiconductor package 100 may be formed to include topside-cooling component 115 and the second set of leads 120. In some implementations, topside-cooling component 115 and the second set of leads 120 may be formed from conductive material 405.

Figure 4C:
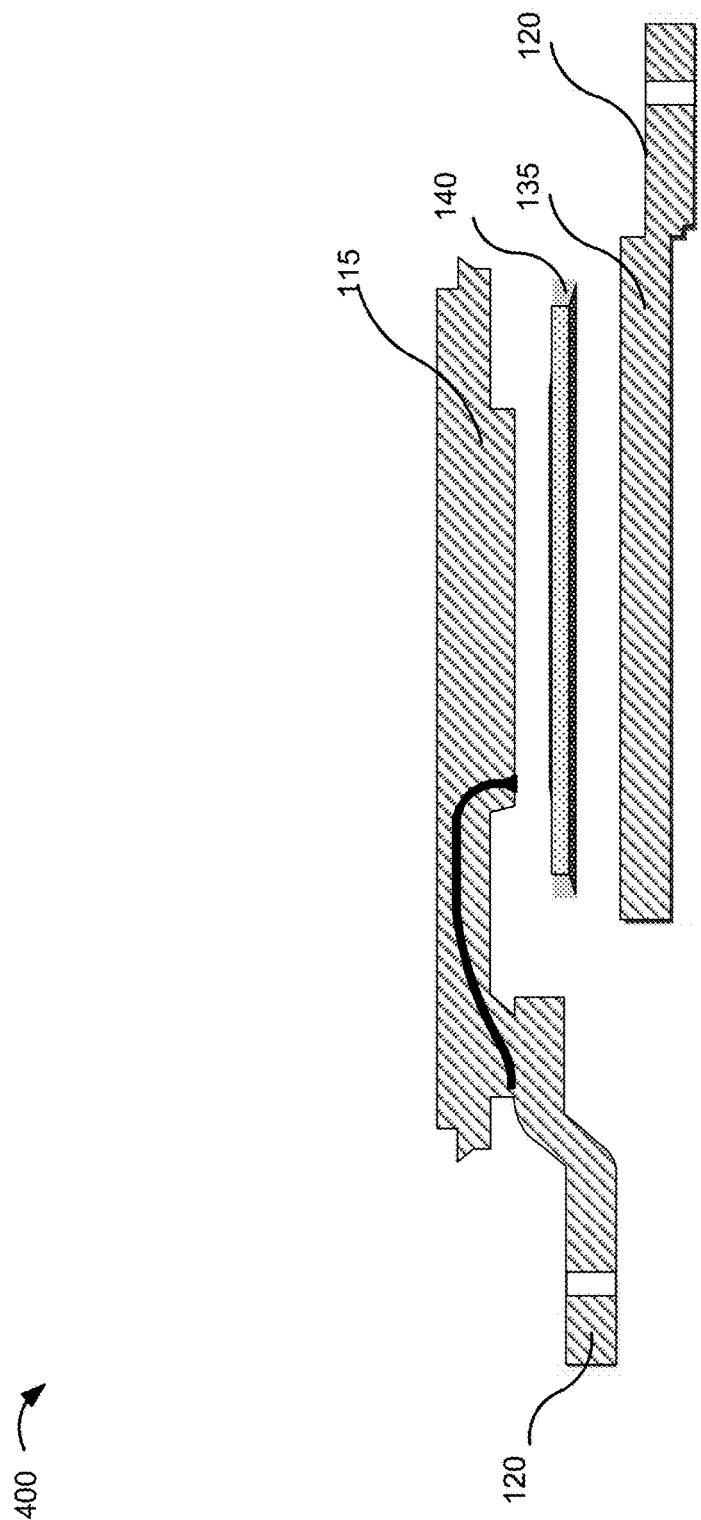
Figure 4D:
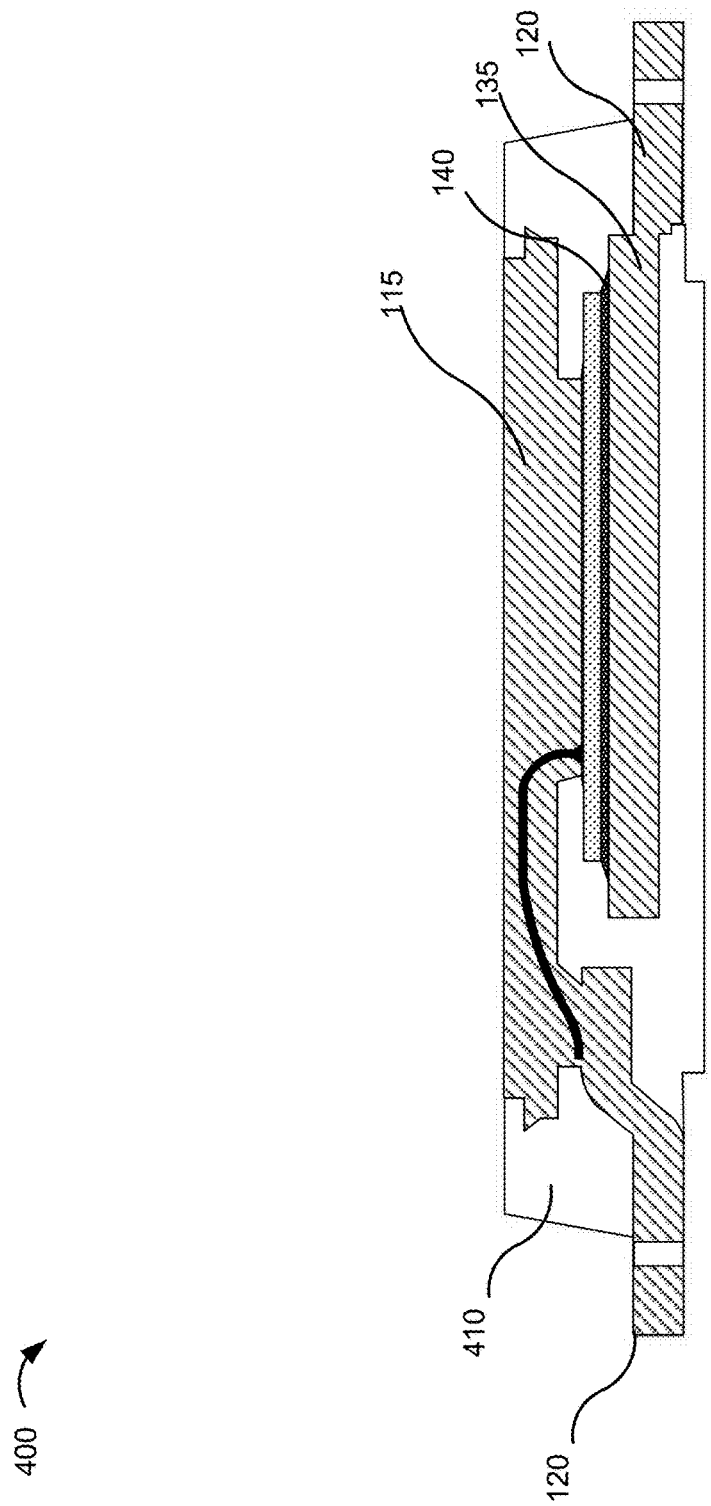

As shown in FIG. 4C, a semiconductor assembly may be formed by placing semiconductor 140 of topside-cooled semiconductor package 100 between die pad 135 and topside-cooling component 115. As shown in FIG. 4D, the semiconductor assembly may be placed in a mold 410 that is shaped to form mold structure 105. Mold 410 may include a mold cavity that is shaped to form molded standoff 175. As shown in FIG. 4E, mold 410 may receive a mold compound (e.g., including an insulating material) and the mold compound may be solidified, within mold 410 during a molding process, to form mold structure 105.

As indicated above, FIGS. 4A-4E are provided merely as examples. Other examples may differ from what is described with regard to FIGS. 4A-4E.

Figure 5:
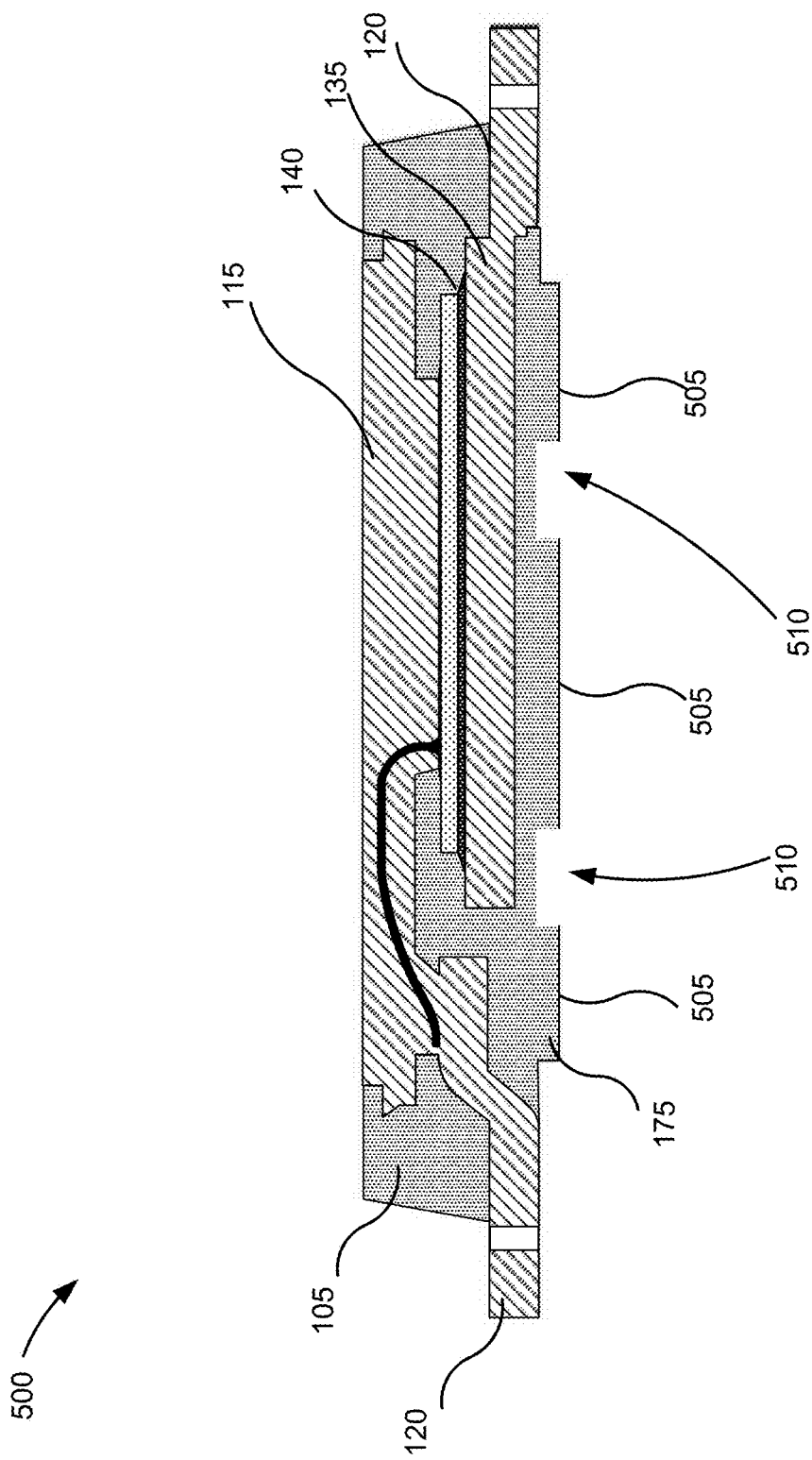
FIG. 5 is a diagram of an example topside-cooled semiconductor package described herein.

FIG. 5 is a diagram of an example molded semiconductor package 500 described herein. As shown in FIG. 5, in some implementations, molded standoff 175 of topside-cooled semiconductor package 100 may include supports 505 and indentations 510 between supports 505. Indentations 510 may create pockets (e.g., air pockets) to reduce heat dissipation toward a bottom surface 125 of topside-cooled semiconductor package 100. Indentations 510 may form channels along bottom surface 180 of molded standoff 175, checkered areas on bottom surface 180, and/or the like.

As indicated above, FIG. 5 is provided merely as an example. Other examples may differ from what is described with regard to FIG. 5.

FIG. 6 is a flow chart of an example process 600 for manufacturing a molded semiconductor package.

As shown in FIG. 6, process 600 may include forming a first conductive portion of the molded semiconductor package, wherein the first conductive portion is formed to include a die pad and a first set of leads, wherein a bottom plane of the first set of leads is offset from a bottom surface of the die pad (block 610). In some implementations, the first conductive portion is formed to include a die pad and a first set of leads. In some implementations, a bottom plane of the first set of leads is offset from a bottom surface of the die pad.

As further shown in FIG. 6, process 600 may include forming a second conductive portion of the molded semiconductor package, wherein the second conductive portion is formed to include a topside-cooling component and a second set of leads (block 620). In some implementations, the second conductive portion is formed to include a topside-cooling component and a second set of leads.

As further shown in FIG. 6, process 600 may include forming a semiconductor assembly by placing a semiconductor of the semiconductor package between the die pad and the topside-cooling component, wherein the semiconductor assembly is formed so that the bottom plane of the first set of leads is coplanar to a bottom plane of the second set of leads to form an electrical contact plane of the molded semiconductor package (block 630). In some implementations, the semiconductor assembly is formed so that the bottom plane of the first set of leads is coplanar to a bottom plane of the second set of leads to form an electrical contact plane of the molded semiconductor package.

As further shown in FIG. 6, process 600 may include forming a mold structure of the molded semiconductor package, wherein the mold structure is formed to enclose the die pad and the semiconductor within the mold structure, wherein the mold structure is formed to have a top surface of the mold structure that is coplanar to a top surface of the topside-cooling component, and wherein the mold structure is formed to have a molded standoff that has a bottom surface that is beneath the die pad and extends below the electrical contact plane (block 640). In some implementations, the mold structure is formed to enclose the die pad and the semiconductor within the mold structure. In some implementations, the mold structure is formed to have a top surface of the mold structure that is coplanar to a top surface of the topside-cooling component. In some implementations, the mold structure is formed to have a molded standoff that has a bottom surface that is beneath the die pad and extends below the electrical contact plane.

Process 600 may include additional implementations, such as any single implementation or any combination of implementations described below and/or in connection with one or more other processes described elsewhere herein.

In a first implementation, forming the first conductive portion of the molded semiconductor package comprises: punching a workpiece from a sheet of conductive material, and stamping the die pad or the first set of leads to offset the die pad from the first set of leads.

In a second implementation, alone or in combination with the first implementation, forming the mold structure of the molded semiconductor package comprises: placing the semiconductor assembly into a mold that is shaped to form the mold structure, and supplying a mold compound, in a fluid state, to the mold, the mold includes a mold cavity that is configured to improve a flow of the mold compound, in the fluid state, into the mold and form the molded standoff; and enabling the mold compound to transition from the fluid state to a solid state to form the mold structure.

In a third implementation, alone or in combination with one or more of the first and second implementations, the mold structure is formed to expose portions of the first set of leads and portions of the second set of leads at the electrical contact plane.

In a fourth implementation, alone or in combination with one or more of the first through third implementations, process 600 includes prior to is forming the mold structure, forming a mold that is shaped to form the mold structure, wherein the mold is being formed to include a mold cavity that is shaped to form the molded standoff.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A topside-cooled semiconductor package, comprising:
   a topside-cooling component;
   a die pad;
   a semiconductor situated between the die pad and the topside-cooling component;
   a plurality of leads,
      wherein a first set of leads, of the plurality of leads, and the die pad are formed from a same piece of conductive material,
      wherein a bottom plane of the first set of leads is offset from a bottom surface of the die pad, and
      wherein a second set of leads, of the plurality of leads, are connected to the topside-cooling component,
         wherein a bottom plane of the second set of leads is coplanar to the bottom plane of the first set of leads within an electrical contact plane of the plurality of leads; and
   a mold structure that is formed to enclose the semiconductor, the die pad, and a portion of the topside-cooling component within the mold structure,
      wherein the mold structure includes a molded standoff that is beneath the die pad and extends downward from the electrical contact plane.

2. The topside-cooled semiconductor package of claim 1, further comprising a trace that connects an electrode of the semiconductor to at least one of the second set of leads.

3. The topside-cooled semiconductor package of claim 1, wherein the bottom plane of the first set of leads is offset from the bottom surface of the die pad by at least half of a thickness of the piece of conductive material, prior to the first set of leads and the die pad being formed.

4. The topside-cooled semiconductor package of claim 1, wherein the topside-cooling component is a same type of material as at least one of:
   the piece of conductive material, or
   the second set of leads.

5. The topside-cooled semiconductor package of claim 1, wherein the molded standoff includes a plurality of supports and a plurality of indentations between the supports.

6. The topside-cooled semiconductor package of claim 1, wherein a thickness of the molded standoff is within a threshold range of half of a distance between the bottom surface of the die pad and the bottom surface of the molded standoff.

7. The topside-cooled semiconductor package of claim 1, wherein a width of the molded standoff is less than a distance between inner edges of the first set of leads and inner edges of the second set of leads.

8. The topside-cooled semiconductor package of claim 1, wherein a bottom surface of the molded standoff is parallel to at least one of:
   the bottom surface of the die pad, or
   a top surface of the topside-cooling component.

9. The topside-cooled semiconductor package of claim 1, wherein the mold structure is formed from a mold compound.

10. The topside-cooled semiconductor package of claim 1, wherein the semiconductor includes at least one of:
    a half bridge, or
    a transistor.

11. A molded semiconductor package arrangement, comprising:
    a die pad configured to support a semiconductor;
    a first set of leads,
       wherein the first set of leads and the die pad are formed from a same piece of conductive material,
          wherein an electrical contact plane of the set of leads is offset from a bottom surface of the die pad; a
          second set of leads connected to a topside-cooling component,
       wherein a bottom plane of the second set of leads is coplanar to the bottom plane of the first set of leads within an electrical contact plane of the molded semiconductor package; and
    a mold structure that is formed to enclose the semiconductor and the die pad within the mold structure,
       wherein the mold structure includes a molded standoff that is beneath the die pad, and wherein a bottom surface of the molded standoff extends below the electrical contact plane of the first set of leads by a threshold distance that corresponds to a thickness of the molded standoff.

12. The molded semiconductor package arrangement of claim 11, further comprising:
a topside-cooling component that is to facilitate topside cooling associated with the semiconductor,
wherein the semiconductor is positioned between the topside-cooling component and the die pad.

13. The molded semiconductor package arrangement of claim 12, wherein a top surface of the mold structure is coplanar to a top surface of the topside-cooling component.

14. The molded semiconductor package of claim 11, wherein the thickness of the molded standoff is greater than or equal to half a thickness of the piece of conductive material.

15. The molded semiconductor package arrangement of claim 11, wherein the molded standoff includes an indentation that is to form an enclosure between a surface of the indentation and a printed circuit board when the molded semiconductor package is installed on the printed circuit board,
wherein the enclosure reduces heat dissipation from the die pad to the printed circuit board.

16. A method of manufacturing a molded semiconductor package, the method comprising:
forming a first conductive portion of the molded semiconductor package,
wherein the first conductive portion is formed to include a die pad and a first set of leads,
wherein a bottom plane of the first set of leads is offset from a bottom surface of the die pad;
forming a second conductive portion of the molded semiconductor package,
wherein the second conductive portion is formed to include a topside-cooling component and a second set of leads connected to the topside-cooling component;
forming a semiconductor assembly by placing a semiconductor of the molded semiconductor package between the die pad and the topside-cooling component,
wherein the semiconductor assembly is formed so that the bottom plane of the first set of leads is coplanar to a bottom plane of the second set of leads to form an electrical contact plane of the molded semiconductor package; and
forming a mold structure of the molded semiconductor package,
wherein the mold structure is formed to enclose the die pad and the semiconductor within the mold structure,
wherein the mold structure is formed to have a top surface of the mold structure that is coplanar to a top surface of the topside-cooling component, and
wherein the mold structure is formed to have a molded standoff that has a bottom surface that is beneath the die pad and extends below the electrical contact plane.

17. The method of claim 16, wherein forming the first conductive portion of the molded semiconductor package comprises:
punching a workpiece from a sheet of conductive material; and
stamping the die pad or the first set of leads to offset the die pad from the first set of leads.

18. The method of claim 16, wherein forming the mold structure of the molded semiconductor package comprises:
placing the semiconductor assembly into a mold that is shaped to form the mold structure; and
supplying a mold compound, in a fluid state, to the mold,
wherein the mold includes a mold cavity that is configured to improve a flow of the mold compound, in the fluid state, into the mold and form the molded standoff; and
enabling the mold compound to transition from the fluid state to a solid state to form the mold structure.

19. The method of claim 16, wherein the mold structure is formed to expose portions of the first set of leads and portions of the second set of leads at the electrical contact plane.

20. The method of claim 16, the method comprises:
prior to forming the mold structure, forming a mold that is shaped to form the mold structure,
wherein the mold is formed to include a mold cavity that is shaped to form the molded standoff.

* * * * *

UNITED STATES PATENT AND TRADEMARK OFFICE
CERTIFICATE OF CORRECTION

PATENT NO. : 11,239,127 B2
APPLICATION NO. : 16/906617
DATED : February 1, 2022
INVENTOR(S) : Edward Myers et al.

It is certified that error appears in the above-identified patent and that said Letters Patent is hereby corrected as shown below:

In the Claims

Claim 11:
Column 10, Line 18, change "wherein an electrical contact plane of the set of leads" to -- wherein an electrical contact plane of the first set of leads --

Signed and Sealed this
Fifteenth Day of March, 2022

Drew Hirshfeld
*Performing the Functions and Duties of the
Under Secretary of Commerce for Intellectual Property and
Director of the United States Patent and Trademark Office*